United States Patent
Brewster et al.

(10) Patent No.: US 12,334,658 B2
(45) Date of Patent: Jun. 17, 2025

(54) STRAIN RELIEF PLUG FOR LEAD WIRES ON A PRINTED CIRCUIT BOARD

(71) Applicant: KOLLMORGEN CORPORATION, Radford, VA (US)

(72) Inventors: Jeffery Todd Brewster, Dublin, VA (US); William Edward Anderson, IV, Blacksburg, VA (US); Tyler William Wood, Radford, VA (US); Elizabeth Cantando, Blacksburg, VA (US)

(73) Assignee: KOLLMORGEN CORPORATION, Radford, VA (US)

( * ) Notice: Subject to any disclaimer, the term of this patent is extended or adjusted under 35 U.S.C. 154(b) by 249 days.

(21) Appl. No.: 17/989,909

(22) Filed: Nov. 18, 2022

(65) Prior Publication Data
US 2023/0163494 A1 May 25, 2023

Related U.S. Application Data

(60) Provisional application No. 63/281,276, filed on Nov. 19, 2021.

(51) Int. Cl.
*H01R 12/51* (2011.01)
*H01R 12/53* (2011.01)
*H05K 1/11* (2006.01)

(52) U.S. Cl.
CPC ........... *H01R 12/53* (2013.01); *H01R 12/515* (2013.01); *H05K 1/11* (2013.01); *H05K 2201/10189* (2013.01)

(58) Field of Classification Search
CPC ....... H01R 12/515; H05K 2201/10356; H05K 2201/10189; H05K 1/11
See application file for complete search history.

(56) References Cited

U.S. PATENT DOCUMENTS 4,191,440 A 3/1980 Schramm
4,295,696 A 10/1981 Gray
(Continued)

FOREIGN PATENT DOCUMENTS

JP  H02297503 A2  12/1990
WO  1997029526 A1  8/1997

OTHER PUBLICATIONS

Hellermann Tyton Catalogue 2022-2023, pp. 134-136 https://www.hellermanntyton.com/binaries/content/assets/downloads/com/product_catalogue_2022-2023/ht_product_catalogue_2022-2023_com.pdf.
(Continued)

*Primary Examiner* — Jeremy C Norris
(74) *Attorney, Agent, or Firm* — Day Pitney LLP; George Chaclas; Anthony A. Kassas

(57) ABSTRACT

A strain relief plug to restrict movement of wires on a printed circuit board, the strain relief plug having an elongated stem along a vertical axis of the strain relief plug. The strain relief plug has an in-board flange defined by the elongated stem, the in-board flange configured to seat in a bore defined by the printed circuit board. The strain relief plug has an anchor defined by a first end of the elongated stem configured to prevent the strain relief plug from releasing from the printed circuit board. The strain relief plug has a bar defined by a second end of the elongated stem and transverse the vertical axis, the bar forming wire channels. The strain relief plug provides strain relief for wires on the printed circuit board of an electric motor in a vertical dimension resembling the thickness of the printed circuit board.

17 Claims, 12 Drawing Sheets

(56) References Cited

U.S. PATENT DOCUMENTS

| | | | |
|---|---|---|---|
| 4,448,474 A | 5/1984 | Melnychenko | |
| 4,669,688 A | 6/1987 | Toh et al. | |
| 4,770,645 A | 9/1988 | Antes | |
| 5,306,162 A | 4/1994 | Armendariz | |
| 5,344,338 A | 9/1994 | Colleran et al. | |
| 6,421,494 B1 | 7/2002 | Battey et al. | |
| 6,951,475 B2 | 10/2005 | Silva | |
| 7,304,861 B2 | 12/2007 | Takahashi | |
| 8,028,962 B2 | 10/2011 | Geiger | |
| 8,844,883 B2 | 9/2014 | Tsutsumi | |
| 2003/0189140 A1 | 10/2003 | Takeuchi | |
| 2005/0245118 A1 | 11/2005 | Liu et al. | |
| 2007/0137888 A1* | 6/2007 | Takahashi | H05K 3/301 174/260 |
| 2011/0070762 A1* | 3/2011 | Hiramatsu | H01R 12/7023 439/329 |
| 2012/0217355 A1 | 8/2012 | Geiger et al. | |
| 2019/0131723 A1* | 5/2019 | Txarola | H01R 13/40 |
| 2019/0393623 A1 | 12/2019 | Chiyajo et al. | |
| 2022/0033154 A1 | 2/2022 | Geiger et al. | |

OTHER PUBLICATIONS

International Search Report and Written Opinion in International Application No. PCT/US2022/050356, dated Apr. 21, 2023, 17 pages.

* cited by examiner

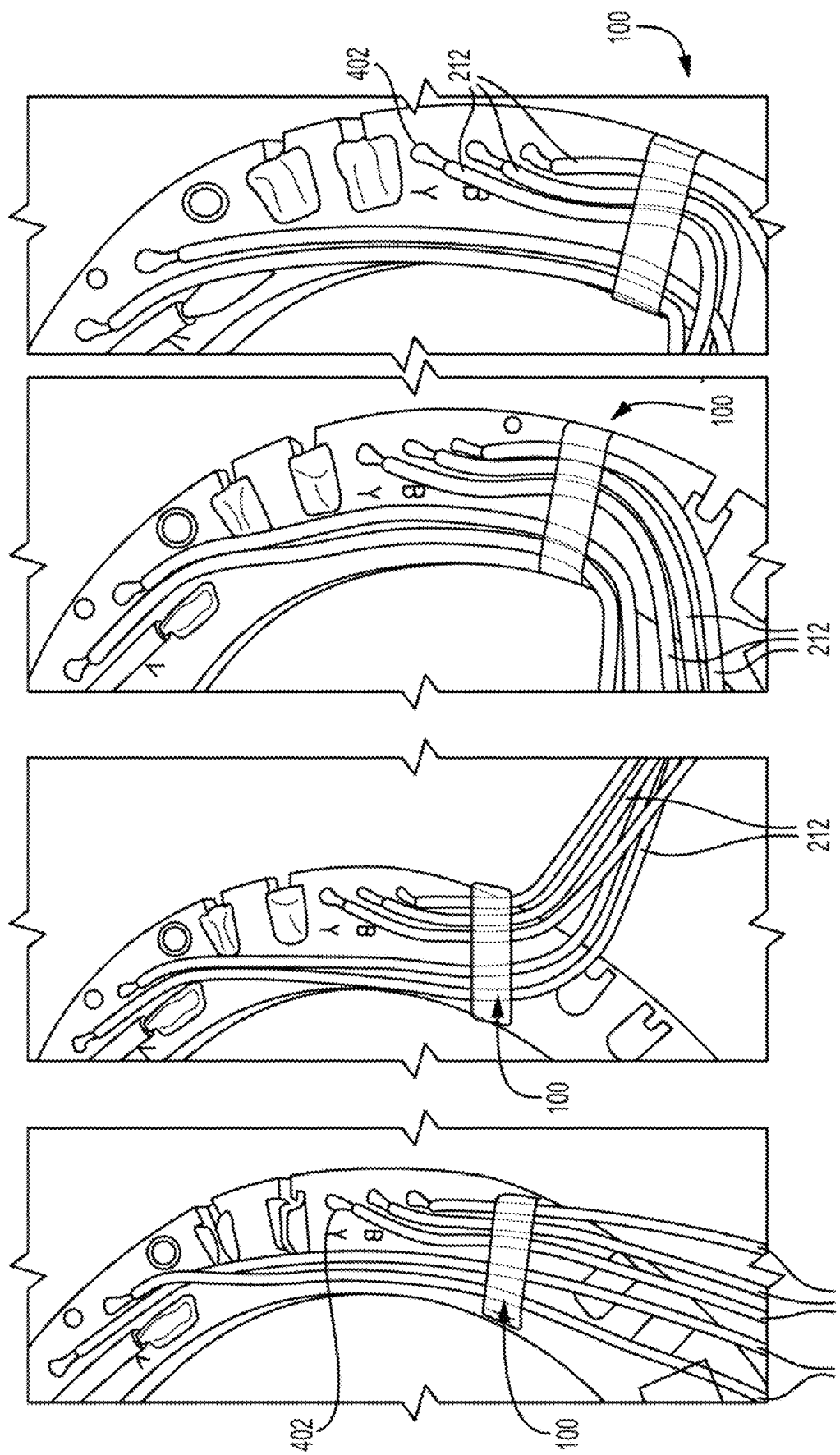

STRAIN RELIEF PLUG FOR LEAD WIRES ON A PRINTED CIRCUIT BOARD

CROSS-REFERENCE TO RELATED APPLICATIONS

The present application claims priority to U.S. Provisional Patent Application No. 63/281,276 dated Nov. 19, 2021, the contents of which are incorporated by reference herein in its entirety for all purposes.

FIELD OF THE DISCLOSURE

The subject disclosure relates to strain relief for connector wires, and more particularly to a strain relief that may be readily inserted into a printed circuit board to relieve pulling forces imparted on connector wires secured to a connector device.

BACKGROUND

Lead wires may be secured to a connector by soldering or bonding procedures to attain an electrical connection, but these securing options are relatively weak and are subject to failure upon mechanical pulling forces imparted on the wires. When soldering lead wires to a printed circuit board, the solder joint may be subject to stress that requires strain relief. If the cable wire flexes, the quality of the electrical conductivity will degrade and the wire may break off of the printed circuit board, resulting in device failure. During assembly, testing, use, and maintenance of printed circuit boards having such connections, the lead wires are frequently pulled from the modules and boards. In order to protect the soldered joints, strain relief devices have been developed.

Existing products in the marketplace to fulfill the necessity for strain relief of wires on a printed circuit board demonstrate opportunities for improvement. Strain relief of wires adhered to printed circuit boards has been accomplished by various means. In many instances, electrical connections are made within a connector housing that is then affixed to the printed circuit board. In these devices, the apparatus contains and protects bare wire contacts, pin-socket, or soldered connections. In such instances, all of the electrical connections are made in an array at one location. This requirement constrains the configuration of the electrical and may not be suitable for all applications.

Strain relief devices also exist that do not function as connectors. The mechanism by which the strain relief device is attached to the printed circuit board or wire rack is one feature that characterizes them. These include press-fitting posts, stand-offs, through-hole technology, screws, adhesives, and side clamping mechanisms. Complex multi-part assemblies may require tools and installation time that are unsuitable for high volume production. Simple designs may employ snaps, clips, or ties to secure wires in places, but these may exhibit weak structural integrity unsuitable for applications requiring high reliability. These and others frequently exhibit excessive vertical profiles that extend the height of the assembly significantly above the height of the printed circuit board. This precludes their use in low profile applications, such as those of an electric motor. As always, planform area is an important consideration in the design of circuit board layouts. Reliability and ease of use are often in conflict while both remain important considerations in the design of electronics. An efficient solution is required to advance the state of the art.

The subject disclosure is contemplated for use in an electric motor of the type such as a permanent magnet brushless motor that is disclosed by U.S. Pat. No. 7,105,973 BS, issued Sep. 12, 2006, the entirety of which is corporate by reference herein. The subject disclosure may also be implemented by those skilled in the art to other electric motor types and topologies including, but not limited to linear motors, outside rotating motors, hybrid steppers, permanent magnet steppers, variable reluctance motors, switched reluctance motors, or other polyphase electric motors.

An electric motor using a printed circuit board with a strain relief plug includes a rotor (not pictured) and a stator having a plurality of coils wrapped thereon, the coils comprising field windings. Electric motors may have single or multi-phase windings, and it is common for multiphase stators to be connected in either a star-wye connection pattern or a delta connection pattern with each motor phase having one or more stator field windings coils.

The flow of current into the field windings can be controlled and adjusted by motor control electronics via lead wires to produce a desired magnetic field and corresponding motor performance. Lead wires of individual motor phases, which are connected to the motor control electronics, may be soldered to the printed circuit board, and require strain relief using the technology of the subject disclosure.

The printed circuit board may also contain sensor devices used by the motor control electronics, such as position sensors or thermal devices. The lead wires of the individual sensor devices may be soldered to the printed circuit board and require strain relief using the technology of the subject disclosure.

SUMMARY

The subject technology is directed to a strain relief plug to restrict movement of one or more lead wires on a printed circuit board. The strain relief plug includes an elongated stem along a vertical axis of the strain relief plug. The strain relief plug includes an in-board flange defined by the elongated stem, the in-board flange configured to seat in a bore defined by the printed circuit board restricts lateral motion of the strain relief plug. The strain relief plug includes an anchor defined by a first end of the elongated stem configured to prevent the strain relief plug from releasing from the printed circuit board. The strain relief plug includes a bar defined by a second end of the elongated stem and transverse the vertical axis, the bar forming one or more lead wire channels to trap the one or more lead wires.

In one implementation, the bar may include turned ends. In another implementation, the anchor may include one or more flexible barbs. In another implementation, the one or more flexible barbs of the anchor may extend outwardly from the elongated stem transverse the vertical axis to form a gap between the anchor and the bar, the gap sized relative to a thickness of the printed circuit board. In another implementation, the strain relief plug may include one or more brackets defined by the elongated stem and extending transverse the vertical axis, the one or more brackets joining the bar, wherein the anchor extends outwardly toward the one or more brackets to form a gap between the anchor and the one or more brackets, the gap sized relative to a thickness of the printed circuit board.

In another implementation, the bar may be configured to pin the one or more lead wires against the printed circuit board.

In yet another implementation, the one or more lead wire channels is sized relative to a thickness of the printed circuit board and one or more lead wires.

In yet another implementation, the in-board flange may include a radial body having a tapered profile on an edge thereof to aid installation into the bore defined by the printed circuit board. The in-board flange restricts lateral motion of the strain relief plug while the anchor feature prevents the plug from releasing from the printed circuit board, but the combination of these two features does not over constrain the azimuthal orientation of the plug. Providing a range of angular positions for the installation of the strain relief plug to align with respect to various positions of wires is a significant advantage of the present invention.

In yet another implementation, the bar, defined by a second end of the elongated stem and transverse the vertical axis, may include a reinforcing spine affixed to the bar.

The subject technology is directed to a printed circuit board including one or more lead wires soldered to the printed circuit board forming one or more solder joints. The printed circuit board includes a strain relief plug having an elongated stem along a vertical axis of the strain relief plug, an in-board flange defined by the elongated stem, the in-board flange configured to seat in a bore defined by the printed circuit board, an anchor defined by a first end of the elongated stem having one or more flexible barbs configured to prevent the strain relief plug from releasing from the printed circuit board, and a bar defined by a second end of the elongated stem and transverse the vertical axis, the bar having turned ends to form one or more lead wire channels to trap the one or more lead wires. The one or more barbs extend outwardly toward the bar to form a gap between the one or more barbs and the turned ends, the gap sized relative to a thickness of the printed circuit board.

BRIEF DESCRIPTION OF THE DRAWINGS

Various aspects of the present disclosure are discussed herein with reference to the accompanying Figures. It will be appreciated that for simplicity and clarity of illustration, elements shown in the drawings have not necessarily been drawn accurately or to scale. For example, the dimensions of some of the elements can be exaggerated relative to other elements for clarity or several physical components can be included in one functional block or element. Further, where considered appropriate, reference numerals can be repeated among the drawings to indicate corresponding or analogous elements. For purposes of clarity, however, not every component can be labeled in every drawing. The Figures are provided for the purposes of illustration and explanation and are not intended as a definition of the limits of the disclosure.

FIGS. 4a-4e are overhead perspective views of the strain relief plug of FIG. 1 installed on a printed circuit board.

FIG. 7b-7c are perspective views of the electric motor armature of FIG. 7a.

DETAILED DESCRIPTION

Figure 1:
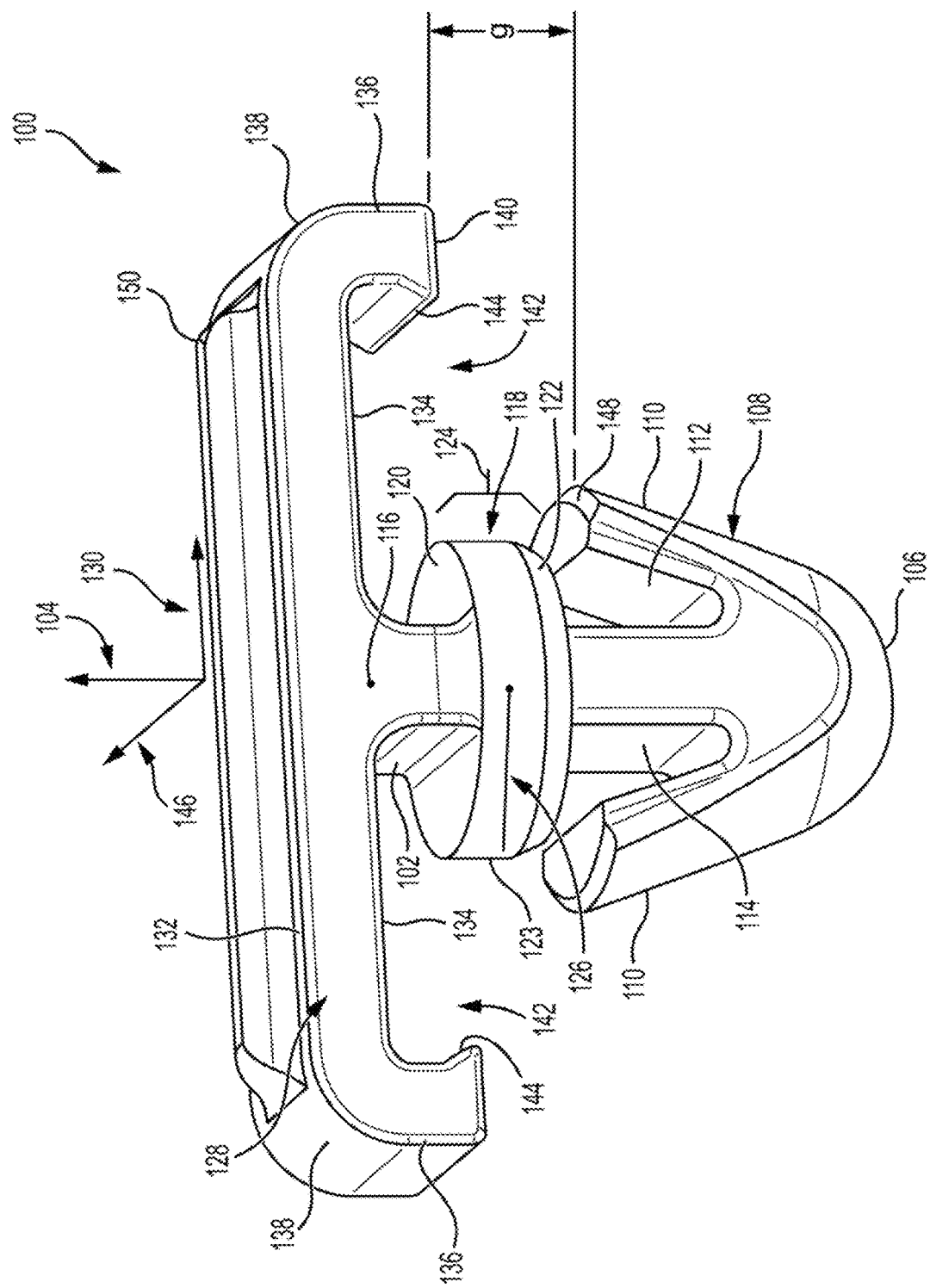
FIG. 1 is an isolated perspective view of a strain relief plug in accordance with the subject disclosure.

The subject technology overcomes many of the prior art problems associated with strain relief devices. The advantages, and other features of the technology disclosed herein, will become more readily apparent to those having ordinary skill in the art from the following detailed description of certain exemplary embodiments taken in combination with the drawings and wherein like reference numerals identify similar structural elements. It should be noted that directional indications such as vertical, horizontal, upward, downward, right, left and the like, are used with respect to the figures and not meant in a limiting manner.

Referring now to FIG. 1, a strain relief plug 100 is shown. The strain relief plug 100 may be readily installed to a printed circuit board or other installations to protect solder joints or other fragile secured wire connections from detrimental pulling forces, tension, stress, and the like. There is a great variety of electrical and solid state equipment including printed circuit boards or modules which are interconnected with other printed circuit boards or modules. This interconnection is enabled by securing interconnecting lead wires through the agency of relatively fragile bonds or solder joints on thin metallic solder pads. In all such instances, it is beneficial that these fragile connections be protected from any damaging mechanical forces encountered in assembling, using, maintaining, and servicing the equipment.

A coordinate system is used herein to help characterize implementations of the strain relief plug 100. For example, a vertical axis 104, a transverse axis 130, and an axial axis 146 are referenced. The vertical axis 104 defines a vertical direction of the strain relief plug 100, the transverse axis 130 is disposed at a 90 degree angle relative to the vertical axis 104 and defines a lateral direction of the strain relief plug 100, and an axial axis 146 is disposed at a 90 degree angle relative to the vertical axis 104 and the transverse axis 130 and defines an axial direction of the strain relief plug 100 and a lead wire direction.

Figure 2A:
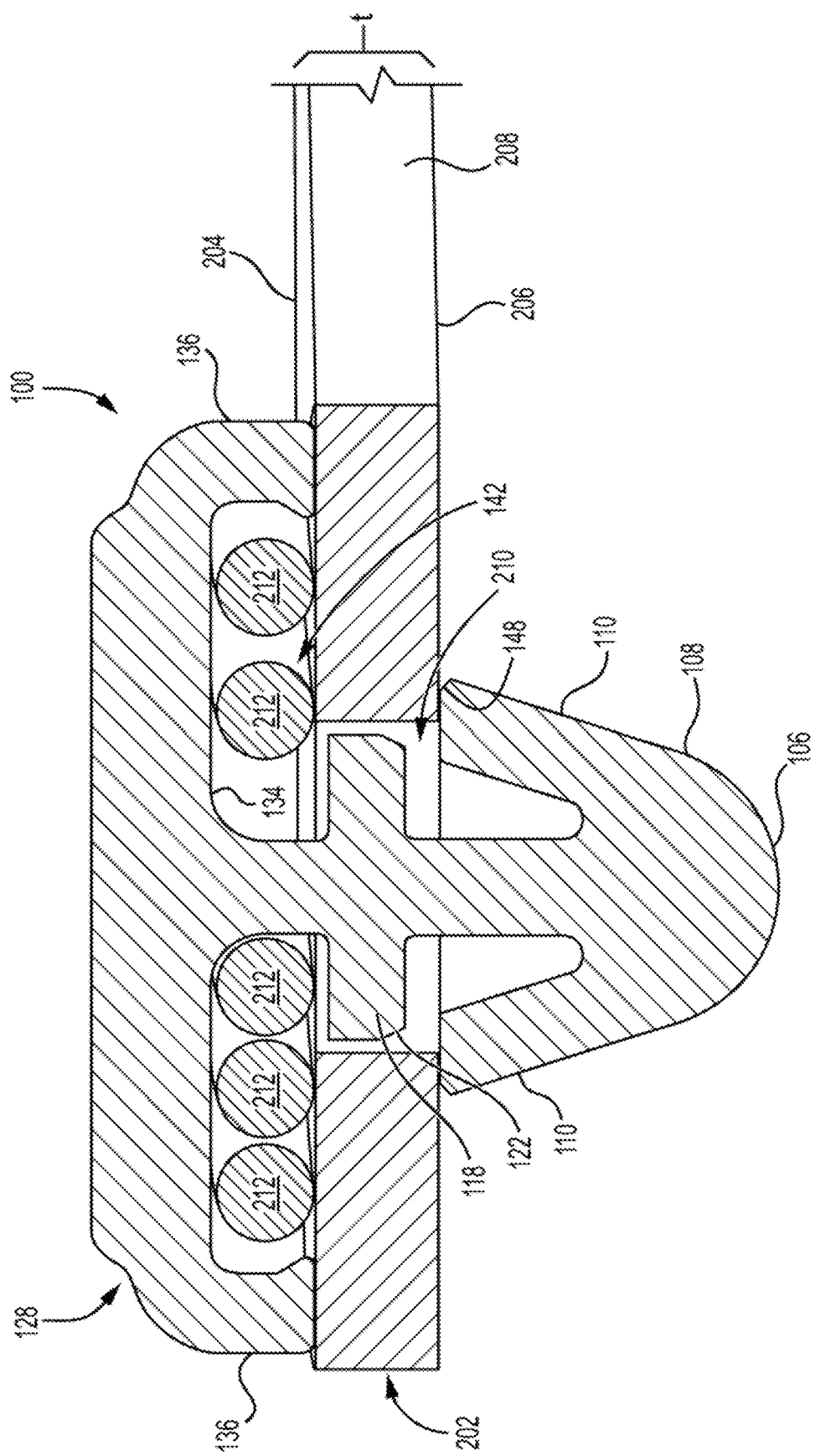
FIGS. 2a-2b are cross-sectional perspective views of the strain relief plug of FIG. 1 installed on a printed circuit board.
Figure 2B:
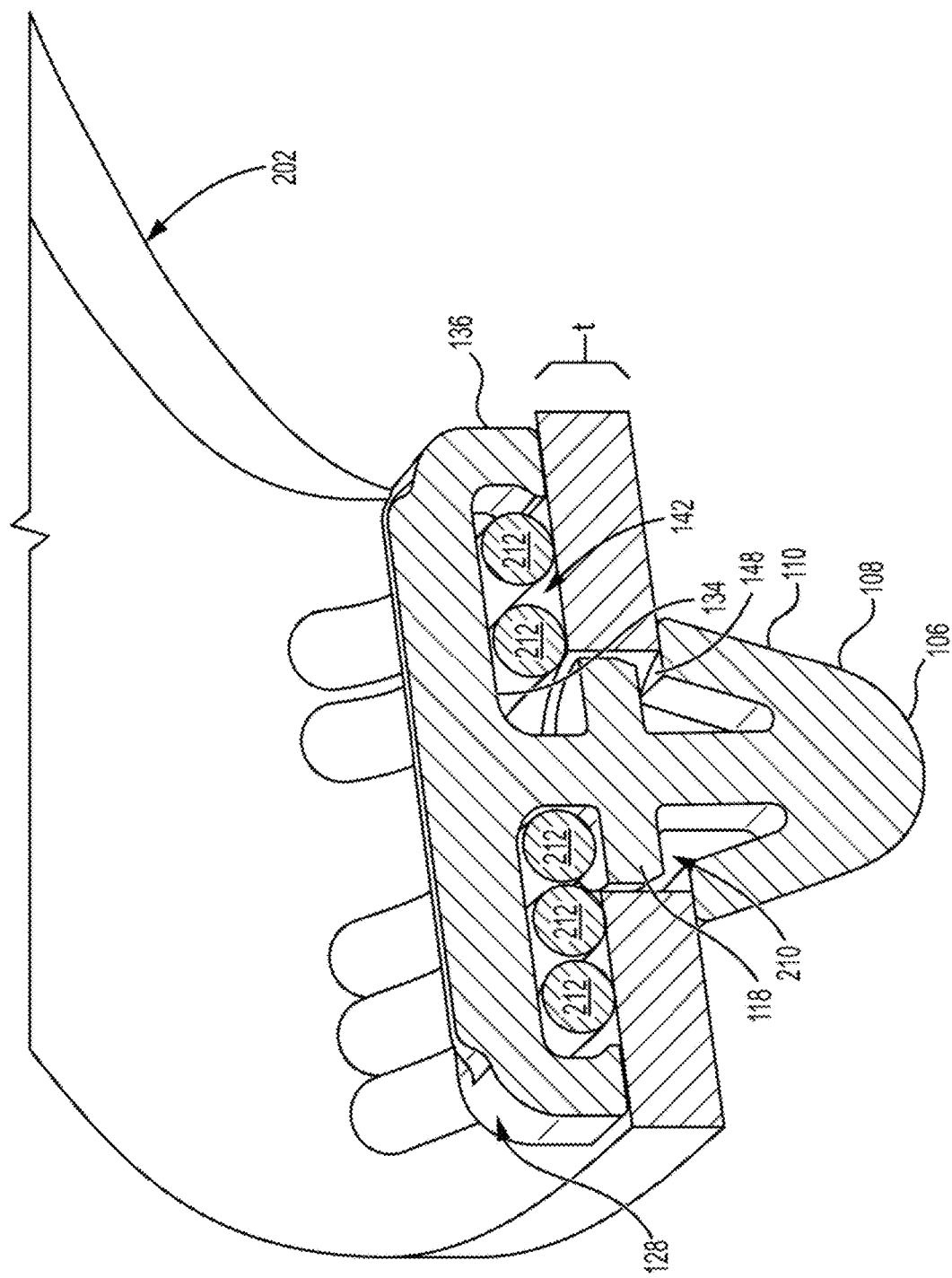
Figure 3:
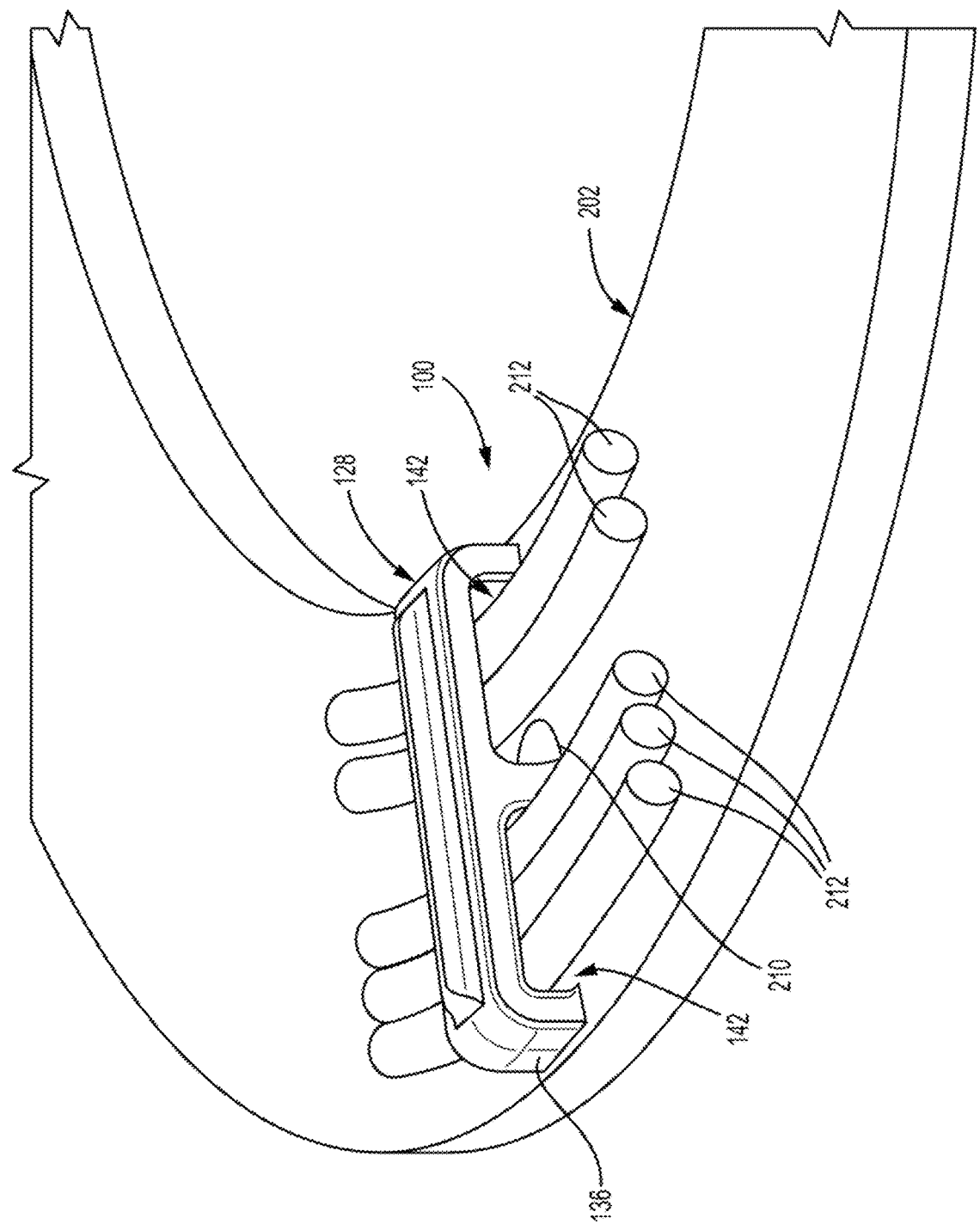
FIG. 3 is a perspective view of the strain relief plug of FIG. 1 installed on a printed circuit board, including one or more lead wires.
Figure 4A:
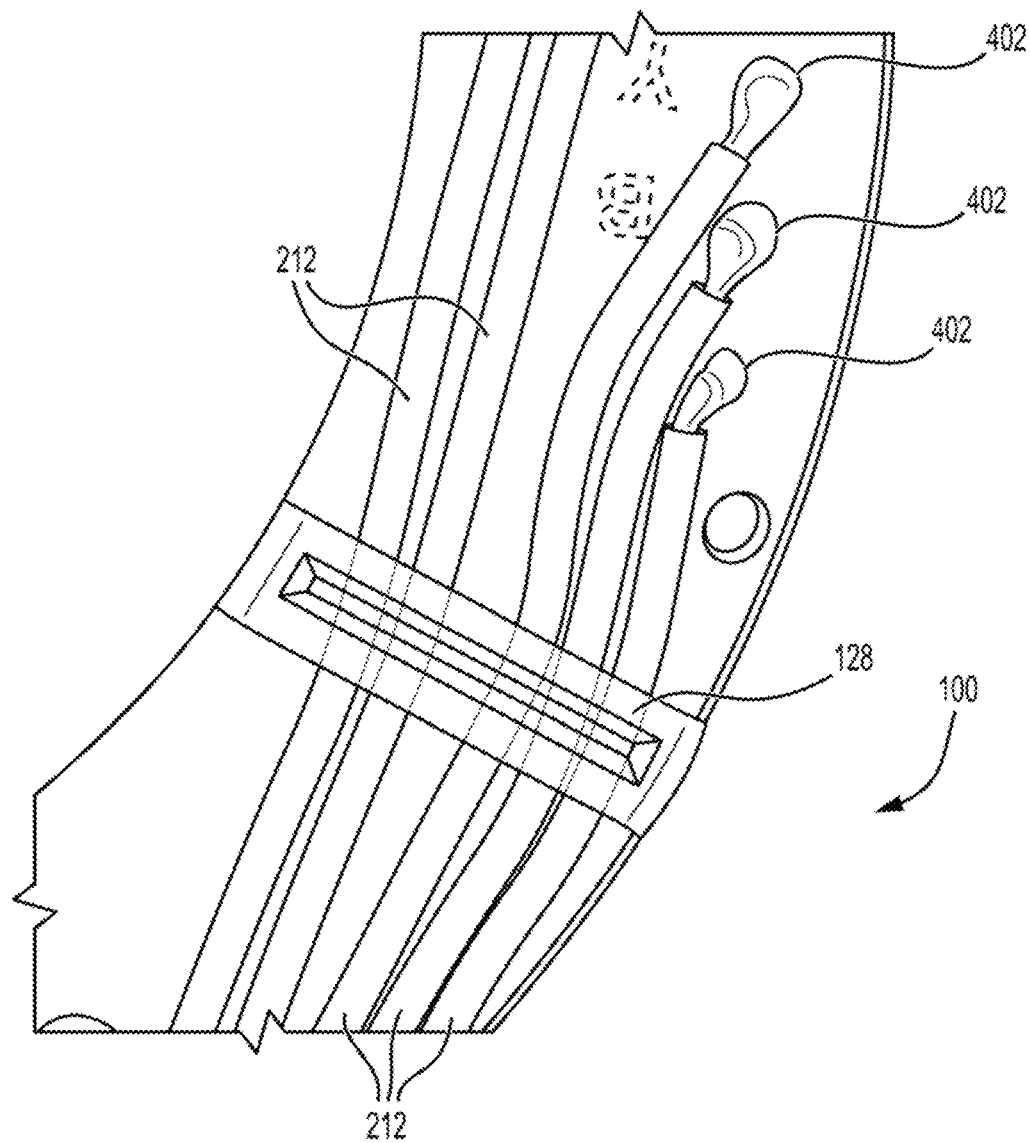

Referring briefly to FIGS. 2a-2b for context, a cross-sectional view is illustrated of a conventional printed circuit board 202 with the strain relief plug 100 of FIG. 1 installed therein. The printed circuit board 202 may include one or more typical flat laminated composites made from non-conductive substrate materials with one or more layers of copper circuitry buried internally or on an external surface. The printed circuit board 202 may include a first surface 204 and an opposing second surface 206 with conventional conductors etched on either the first or second surfaces 204, 206. As referenced herein, the printed circuit board 202 includes a thickness t, shown in greater detail with reference to FIG. 2a. The thickness is defined by a height of a connecting surface 208 joining the first surface 204 and the second surface 206.

Referring to FIGS. 1, 2a, and 2b together, the strain relief plug 100 may be molded from a slightly resilient or flexible plastic. Alternatively, the strain relief plug 100 may include copper, silver, aluminum, gold, steel, or brass portions. The strain relief plug 100 is formed in the general configuration of a "T", which includes an elongated stem 102. The elongated stem 102 runs parallel to a vertical axis 104 of the strain relief plug 100. As illustrated in FIG. 1, the elongated stem 102 terminates at a first end 106 thereof.

The first end 106 includes an anchor 108 defined thereby. The anchor 108 may include one or more flexible barbs 110 configured to prevent the strain relief plug 100 from releasing from the printed circuit board 202. The bore 210 of the printed circuit board 202 may force an inner surface 112 of the one or more flexible barbs 110 to associate with a peripheral surface 114 of the elongated stem 102 upon insertion. Once the first end 106 of the elongated stem 102 has cleared the bore 210 of the printed circuit board 202, the one or more barbs 110 may unassociate and broaden from the peripheral surface 114 such as to rivet, clamp, pin, screw, or otherwise fasten to the printed circuit board 202.

In other implementations, the anchor 108 may include an enlargement or a knob-like projection. In this regard, the anchor 108 may be removably coupled to the elongated stem 102. Upon installation of the strain relief plug 100 into the bore 210 of the printed circuit board 202, and once the first end 106 of the elongated stem 102 has cleared the bore 210 of the printed circuit board 202, the anchor 108 may thereafter be coupled to the first end 106 of the elongated stem 102 such as to rivet, clamp, pin, screw, or otherwise fasten to the printed circuit board 202.

Disposed between the first end 106 and a second end 116 of the elongated stem 102 is an in-board flange 118 defined by the elongated stem 102. The in-board flange 118 may include a radial body. In this regard, the in-board flange 118 may include a curvilinear geometric shape, such as that of a cylinder. The in-board flange 118 may include a first opposing surface 120, a second opposing surface (not shown) opposite thereto, and a lateral side 123 joining the first opposing surface 120 and the second opposing surface. The lateral side 123 may include a height 124 relative to the vertical axis 104 of the strain relief plug 100.

The height 124 of the lateral side 123 of the in-board flange 118 may resemble the thickness t of the printed circuit board 202. For example, the height 124 may be the same as the thickness t of the printed circuit board 202, slightly larger the thickness t of the printed circuit board 202, or slightly less than the thickness t of the printed circuit board 202. In the same respect, the in-board flange 118 may include a radius 126. The radius 126 may resemble a radius of the bore 210 defined by the printed circuit board 202, shown in greater detail with reference to FIG. 2a. For example, the radius 126 may be the same as the radius of the bore 210, slightly larger the radius of the bore 210, or slightly less than the radius of the bore 210.

The in-board flange 118 configured to seat in a bore 210 defined by the printed circuit board 202 restricts transverse 130 motion of the strain relief plug 100, does not restrict rotation of the plug 100, and allows for installation at an arbitrary angular position.

The in-board flange also does not over constrain an azimuthal orientation of the plug 100. This provides a range of angular position for the installation of the strain relief plug 100 to align with respect to various position of wires 212.

In FIGS. 2a-2b, the in-board flange 118 fits snug in the bore 210. Thus, the in-board flange 118 has a smaller radius 126 than the radius of the bore 210. The difference in radius may be miniscule to enable a close-fit between the two components.

The in-board flange 118 may include a beveled edge 122. The beveled edge 122 may have a tapered profile to aid installation of the strain relief plug 100 into the bore 210 defined by the printed circuit board 202. The beveled edge 122 may slope inwardly such that the first opposing surface 120 has a greater radius than the second opposing surface. As such, the beveled edge 122 may include a varying radius.

The second end 116 of the elongated stem 102 defines a bar 128. The bar 128 extends along a transverse axis 130 relative to the vertical axis 104 of the strain relief plug 100. In one implementation, the bar 128 may include a three-dimensional U-shape having a flat mounting surface 132 and one or more subjacent surfaces 134. In another implementation, the bar 128 may include a portion of a three-dimensional annular shape, torus shape, or ellipsoid shape. In yet another implementation, the bar 128 may include a three-dimensional rectangular shape having a flat mounting surface 132 and one or more flat subjacent surfaces 134.

In one implementation, the bar 128 may include a spine 150 mounted to the mounting surface 132. The spine 150 may extend along the transverse axis 130 and provide support to the U-shape structure of the bar 128.

The bar 128 may include turned ends 136. For example, the mounting surface 132 may extend along the transverse axis 130 to a mounting surface curve 138, and thereafter extend vertically along the vertical axis 104, parallel to the elongated stem 102, defining the turned ends 136. The mounting surface 132 may meet the one or more subjacent surfaces 134 at a turned end periphery 140 to form the three-dimensional U-shape mentioned.

The bar 128 and the anchor 108 form a gap g. For example, in one implementation, the turned end periphery 140 and a flexible barb periphery 148 may form the gap g. The one or more flexible barbs 110 and the turned ends 136 may each include a respective height relative to the vertical axis 104 to adjust the length, width, or height dimension of the gap g. In a preferred implementation, the one or more flexible barbs 110 and the turned ends 136 form a gap g having a vertical dimension resembling the thickness t of the printed circuit board 202 and one or more lead wires 212. For example, the gap g may have a vertical dimension equal to, slightly less than, or slightly larger than the thickness t of the printed circuit board 202.

To install, the strain relief plug 100 may be inserted into the bore 210 defined by the printed circuit board 202. The one or more flexible barbs 110 are configured to prevent the strain relief plug from releasing from the printed circuit board 202 as a flexible barb periphery 148 makes contact with the second surface 206 of the printed circuit board 202.

Once the strain relief plug 100 is installed in the bore 210 of the printed circuit board 202 as shown in FIGS. 2a-2b, the turned ends 136 and the one or more flexible barbs 110 make contact with opposite sides of the printed circuit board 202, restricting movement of the printed circuit board 202 relative to the vertical axis 104 of FIG. 1.

Additionally, the bar 128 forms one or more lead wire channels 142 to trap or restrict the one or more lead wires 212 on the printed circuit board 202. In one implementation, the turned ends 136 may include an outward ledge 144 to restrict movement of the one or more lead wires 212 along the transverse axis 130. In another implementation, the subjacent surface 134 of the bar 128 may restrict movement of the one or more lead wires 212 along the vertical axis 104. In yet another implementation, the subjacent surface 134 of the bar 128 may restrict movement of one or more lead wires 212 along a transverse axis 130 by pinning the one or more lead wires 212 against the printed circuit board 202. In yet another implementation, the subjacent surface 134 of the bar 128 may restrict movement of the one or more lead wires 212 along an axial axis 146 by pinning the one or more lead wires 212 against the printed circuit board 202. In yet another implementation, the turned ends 136, subjacent surface 134 of the bar 128, and the first opposing surface 120 of the in-board flange 118 form one or more lead wire channels 142 to trap the one or more lead wires 212 on the printed circuit board 202.

In FIGS. 2a-2b, the one or more lead wires are restricted in motion along the transverse axis 130 of FIG. 1 by the turned ends 136, while the one or more lead wires are restricted in motion along the vertical axis 104 of FIG. 1 by subjacent surface 134 of the bar 128 and the first surface 204 of the printed circuit board 202.

Though, the anchor 108 and in-board flange 118 do not constrain the angular orientation of the plug 100 and allow for variability in the directional alignment of the wires 212 on the printed circuit board 202.

Referring now to FIG. 3 and FIGS. 4a-4e, a perspective view and overhead views of the strain relief plug 100 installed in the bore 210 of the printed circuit board 202 are shown. The strain relief plug 100 restricts motion of the one or more lead wires 212 along the transverse axis 130 and/or vertical axis 104 shown in FIG. 1, with respect to solder joints 402. In turn, detrimental pulling forces, tension, stress, and the like are mitigated on the solder joints 402.

Figure 5:
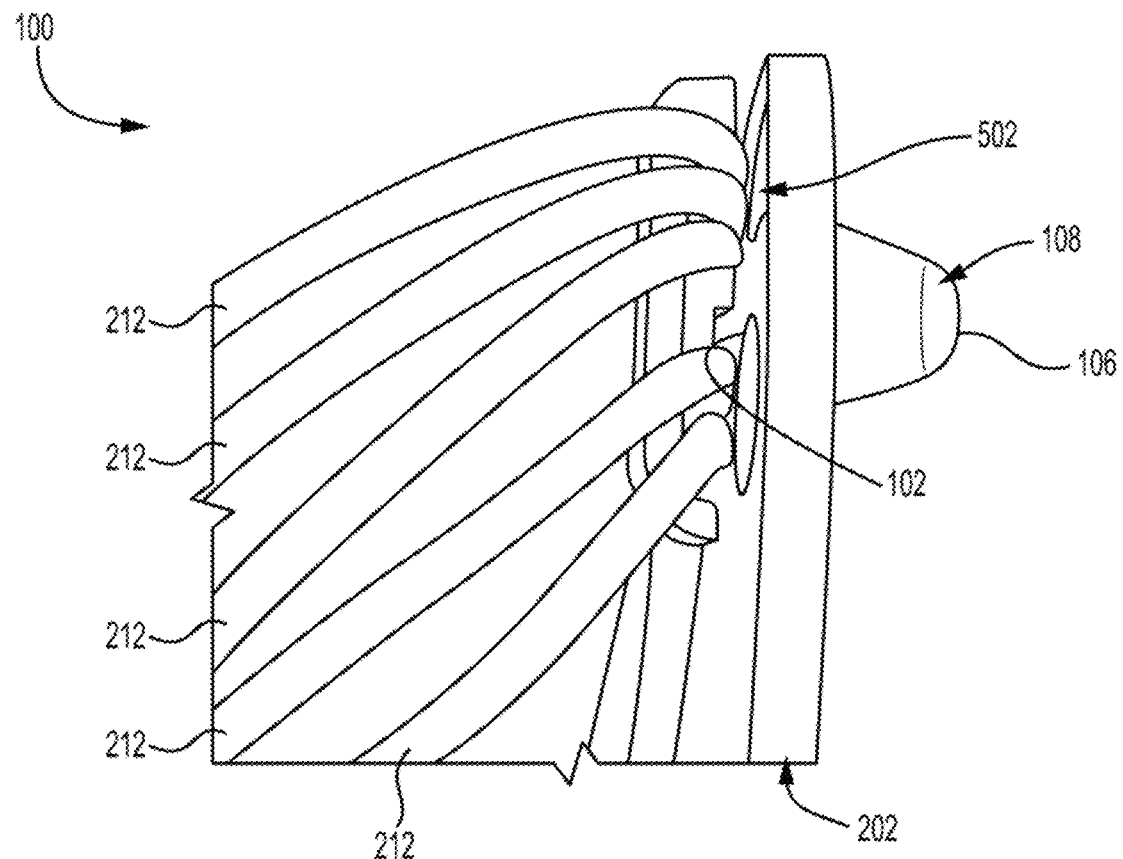
FIG. 5 is a side perspective view of the strain relief plug of FIG. 1 installed on a printed circuit board, showing a wire gap between one or more lead wires and the printed circuit board.

FIG. 5 shows a perspective view of the strain relief plug 100 installed in the bore 210 of the printed circuit board 202. In the implementation shown, the anchor 108 includes an enlargement or a knob-like projection. In this regard, the anchor 108 is removably coupled to the elongated stem 102. Upon installation of the strain relief plug 100 into the printed circuit board 202, the anchor 108 may thereafter be coupled to the first end 106 of the elongated stem 102 such as to rivet, clamp, pin, screw, or otherwise fasten to the printed circuit board 202.

FIG. 5 also shows a wire gap 502 between the one or more lead wires 212 and the circuit board 202. As such, the one or more lead wires 212 need not make contact with the first surface 204 of the circuit board 202 to restrict movement. Similarly the one or more lead wires 212 need not make contact with the turned ends 136 of the strain relief plug 100. Rather, in both scenarios, the first surface 204 or the turned ends 136 may provide a motion boundary in which the one or more lead wires can move along the vertical 104 and transverse axis 130.

Figure 6A:
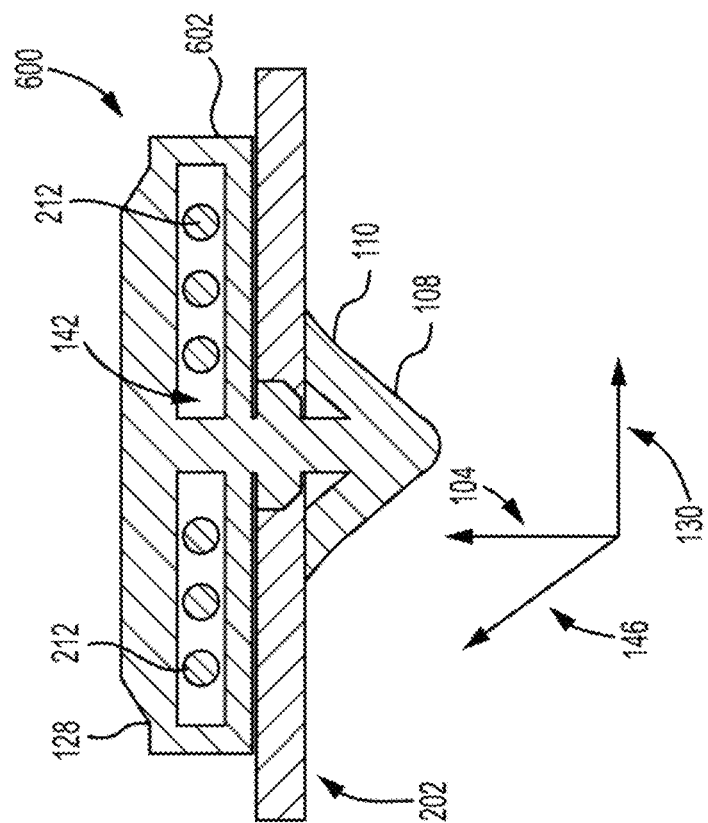
FIGS. 6a-6b are cross-sectional views of another implementation of a strain relief plug in accordance with the subject disclosure.
Figure 6B:
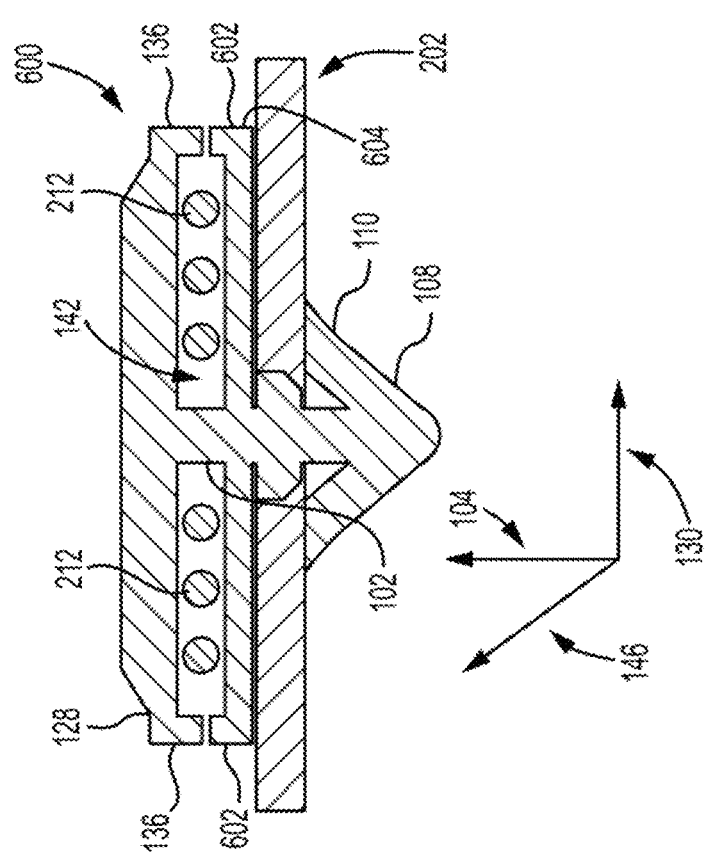

FIGS. 6a-6b show another implementation of a strain relief plug 600, similar to the strain relief plug 100 of FIG. 1. The strain relief plug 600 of FIGS. 6a-6b is different from the strain relief plug 100 in that strain relief plug 600 includes one or more brackets 602. The one or more brackets 602 are defined by the elongated stem 102 and extend along the transverse axis 130 of FIGS. 6a-6b, that is, transverse the vertical axis 104. The one or more brackets 602 join the turned ends 136 to form one or more lead wire channels 142 that are enclosed, encapsulating at least a portion of the one or more lead wires 212. The one or more brackets 602 may form a bracket angle 604 or may curve in order to join the turned ends 136.

Additionally, the strain relief plug 600 is different from the strain relief plug 100 in that the bar 128 of strain relief plug 600 transitions into the turned ends 136 at a rigid angle as opposed to the strain relief plug 100 of FIG. 1. For example, the bar 128 may transition into turned ends 136 at a 90 degree angle. For example, the bar 128 may transition into turned ends 136 at an angle ranging from 1 to 179 degrees.

FIGS. 7a-7d show top, side, and axial views of an electric motor armature 700 with connections to a printed circuit board 202. The electric motor armature 700 carries alternating current. Armature windings conduct AC even on DC machines, due to commutator action (which periodically reverses current direction) or electronic commutation, as in brushless DC motors. The armature 700 can be on either the rotor (rotating part) or the stator (stationary part) of an electric motor, depending on the type of electric machine. The strain relief plug 100 of FIG. 1 is installed to the printed circuit board 202 of the electric motor armature 700. The strain relief plug 100 restricts motion of the one or more lead wires 212 along the transverse axis 130 and/or vertical axis 104 shown in FIG. 1, with respect to solder joints 402. In turn, detrimental pulling forces, tension, stress, and the like are mitigated on the solder joints 402.

Figure 7A:
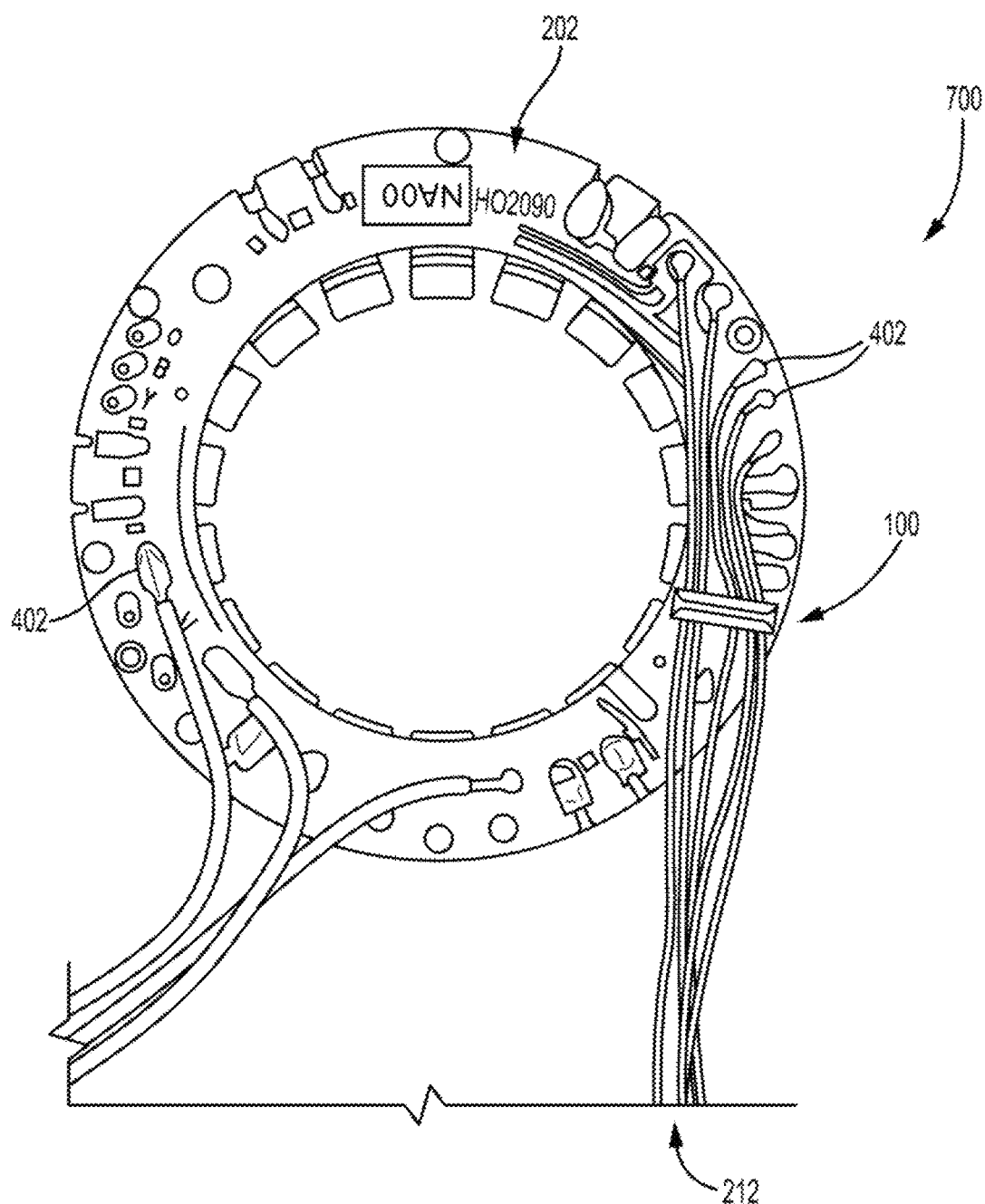
FIG. 7a is a top view of an electric motor armature with connections to a printed circuit board, wherein the strain relief plug of FIG. 1 is installed thereon, acting on sensor lead wires.
Figure 7B:
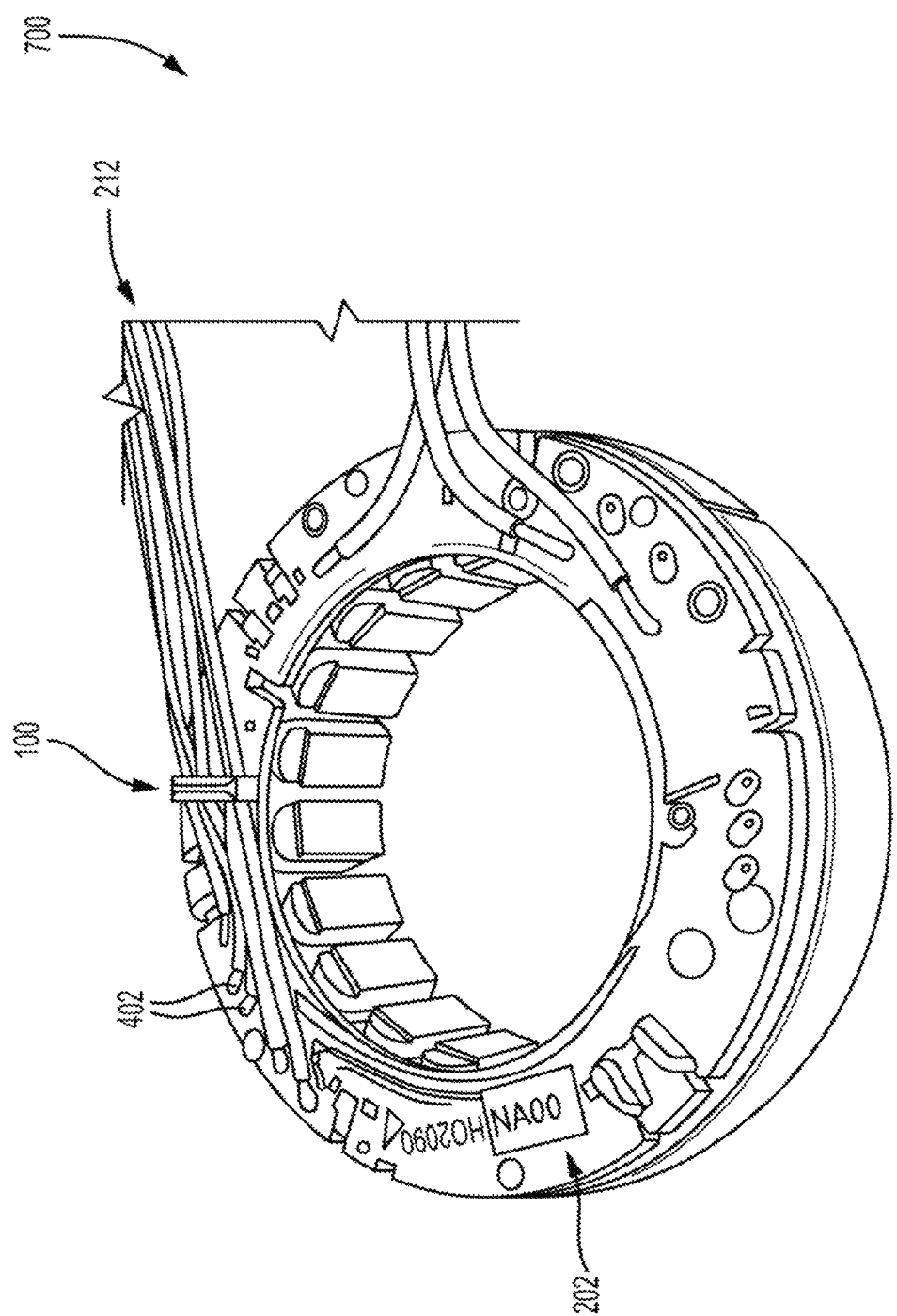
Figure 7C:
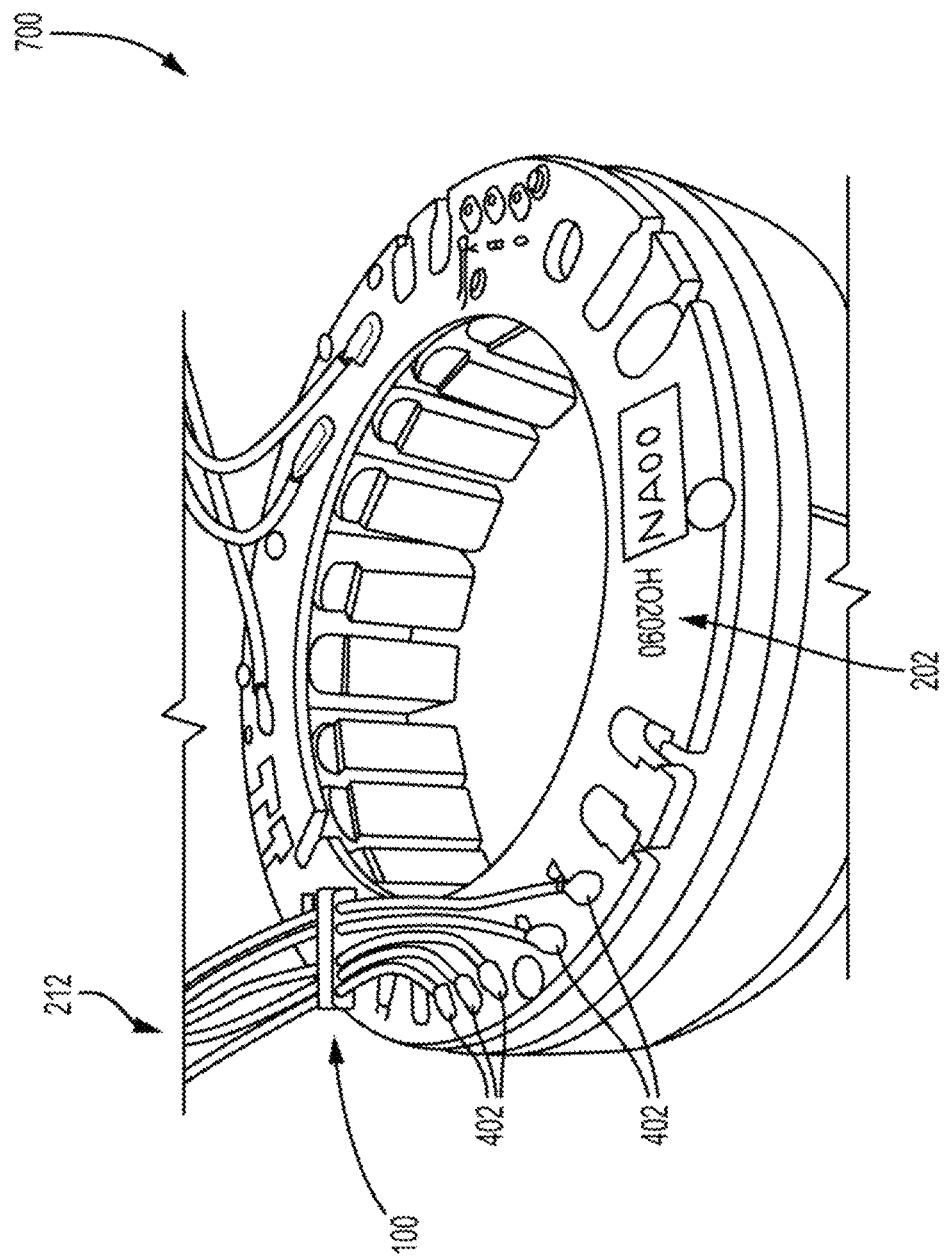
Figure 7D:
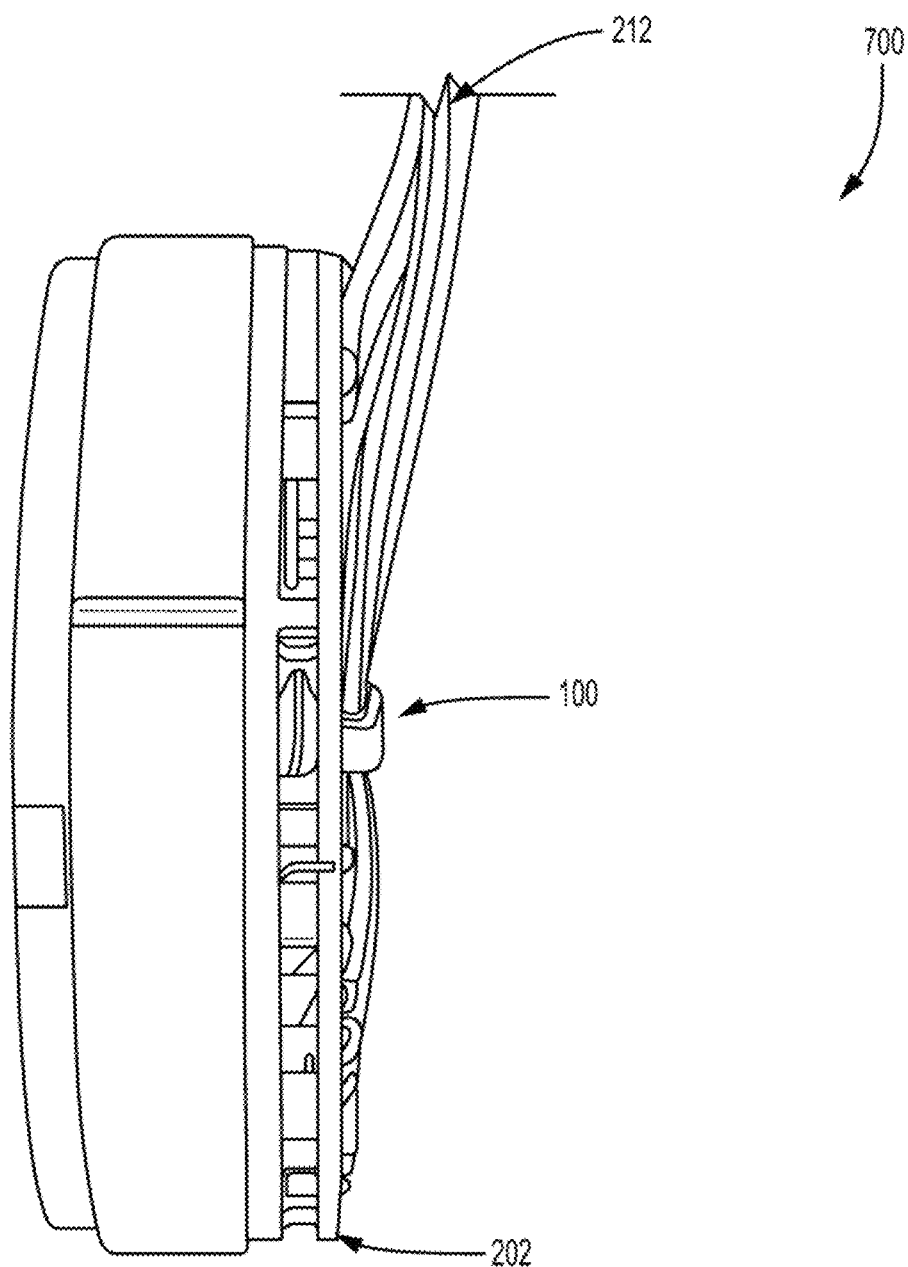
FIG. 7d is a side view of the electric motor armature of FIG. 7a, displaying the profile height of the strain relief plug relative to the thickness of the sensor lead wires and printed circuit board thickness.

Referring specifically to FIG. 7d, the strain relief plug 100 has a relatively low profile height compared to the thickness of the one or more lead wires 212 and printed circuit board 202 thickness. This low profile helps improve the electric motor assembly torque density.

As can be seen, the subject disclosure provides many improvements to strain relief devices. For example, without limitation, the use of the strain relief plug 100, 600 described herein provides strain relief in a vertical direction, resembling the thickness of one or more lead wires and the thickness of a printed circuit board, amounting to a reliable way to protect soldered joints and lead wires connected thereto. During assembly, testing, use, and maintenance of printed circuit boards having such connection, the lead wires are frequently pulled from modules and boards. Further, the subject technology can be adapted to any kind of solder joint, module, or board.

All of the features as described achieve strain relief for solder joints in a considerably low profile topology component compared to commercially available strain reliefs. That is, the strain relief plugs 100, 600 hold lead wires in a manner to prevent stress on a solder joint without adding substantial height to a printed circuit board.

As a further advantage, the strain relief plugs 100, 600 described herein accomplish strain relief of solder joints on electric motor connection printed circuit boards. Electric motor performance is commonly compared on the basis of torque per length or torque per volume. The low profile of strain relief plugs 100, 600 facilitates improvements in torque density on the order of 30% compared to existing products in the marketplace when used for strain relief of solder joints on an electric motor connection printed circuit board.

It will be appreciated by those of ordinary skill in the pertinent art that the functions of several elements can, in alternative embodiments, be carried out by fewer elements, or a single element. Similarly, in some embodiments, any functional element can perform fewer, or different, operations than those described with respect to the illustrated embodiment. Also, functional elements shown as distinct for purposes of illustration can be incorporated within other functional elements in a particular embodiment.

While the subject technology has been described with respect to various embodiments, those skilled in the art will readily appreciate that various changes and/or modifications can be made to the subject technology without departing from the scope of the present disclosure.

What is claimed is:

1. A strain relief plug to restrict movement of one or more lead wires on a printed circuit board, the strain relief plug comprising:
   an elongated stem along a vertical axis normal to a plane of the printed circuit board;
   an in-board flange defined by the elongated stem, the in-board flange configured to seat in a bore defined by the printed circuit board;
   an anchor defined by a first end of the elongated stem configured to prevent the strain relief plug from releasing from the printed circuit board; and
   a bar defined by a second end of the elongated stem and transverse the vertical axis, the bar and the elongated stem configured to form one or more lead wire channels to trap and apply pressure to the one or more lead wires between the bar and the printed circuit board and, in turn, strain relief the one or more lead wires.

2. The strain relief plug of claim 1, wherein the bar has at least one end turned toward the printed circuit board to at least partially enclose the one or more lead wire channels.

3. The strain relief plug of claim 2, wherein the at least one end is configured to contact the printed circuit board and set a height and width of the one or more lead wire channels.

4. The strain relief plug of claim 1, wherein the anchor extends radially outward and toward the bar to form a gap between the anchor and the bar, the gap sized approximately equal to a thickness of the printed circuit board plus the one or more lead wires to create the pressure.

5. The strain relief plug of claim 1, further comprising: one or more brackets defined by the elongated stem and extending transverse the vertical axis, and one or more turned ends depending from the bar so that the one or more brackets, the one or more turned ends, and the elongated step form and enclose the one or more lead wire channels, wherein the anchor forms a contact surface for preventing the anchor from releasing from the printed circuit board, the contact surface defining a gap between the contact surface and the one or more brackets, the gap sized relative to a thickness of the printed circuit board to prevent movement of the strain relief plug along the vertical axis.

6. The strain relief plug of claim 1, wherein the in-board flange is a cylindrical protrusion shaped approximately equal to the bore to prevent movement transverse to the vertical axis.

7. The strain relief plug of claim 1, further comprising a reinforcing spine affixed to the bar, wherein the bar is configured to secure the one or more lead wires directly against the printed circuit board.

8. The strain relief plug of claim 1, wherein the elongated stem has a relatively narrower neck portion between the in-board flange and the bar, the neck portion forming a radially inner portion of the channel with the inner portion being sized and configured to accommodate at least a portion of a lead wire over the in-board flange.

9. A printed circuit board assembly for use in an electric motor, the printed circuit board assembly comprising:
   a printed circuit board defining a bore;
   one or more lead wires soldered to the printed circuit board forming one or more solder joints; and
   a strain relief plug having an elongated stem along a vertical axis of the strain relief plug; an in-board flange defined by the elongated stem, the in-board flange being a cylindrical protrusion configured to seat snugly in the bore to prevent movement of the strain relief plug transverse the vertical axis; an anchor defined by a first end of the elongated stem configured to prevent the strain relief plug from releasing from the printed circuit board; and a bar defined by a second end of the elongated stem and extending transverse the vertical axis, the bar having at least one end that turns toward the printed circuit board to form one or more lead wire channels between the bar and printed circuit board to trap the one or more lead wires therein to provide strain relief,
   wherein the anchor extends radially outward to form a gap between the anchor and the bar, the gap sized approximately equal to a thickness of the printed circuit board plus the one or more lead wires.

10. The printed circuit board assembly of claim 9, wherein: the one or more wires route through the one or more lead wire channels normal to the vertical axis; the bar is configured to press the one or more lead wires against the printed circuit board; and the at least one turned end contacts the printed circuit board to enclose the one or more lead wire channels.

11. The printed circuit board assembly of claim 9, wherein the cylindrical protrusion includes a top surface positioned to support at least one of the one or more lead wires.

12. A strain relief plug to restrict movement of a lead wire on a printed circuit board, the lead wire having an intermediate portion between electrically connected ends that is routed parallel to a plane of the printed circuit board, the strain relief plug comprising:
   an elongated stem along a vertical axis normal to a plane of the printed circuit board, the elongated stem configured to seat in a bore defined by the printed circuit board;
   an anchor formed by a distal end of the elongated stem configured to prevent the elongated stem from releasing from the printed circuit board; and
   a bar coupled to a proximal end of the elongated stem and extending transverse the vertical axis to form a lead wire channel with the printed circuit board to trap and strain relief the intermediate portion of the lead wire between the bar and the printed circuit board.

13. A strain relief plug of claim 12, wherein the elongated stem includes a cylindrical protrusion that snugly seats in a bore defined by the printed circuit board.

14. A strain relief plug of claim 13, wherein the elongated stem has a relatively narrower neck portion between the cylindrical protrusion and the bar, the neck portion forming a radially inner portion of the lead wire channel with the inner portion being sized and configured to accommodate a lead wire over the cylindrical protrusion, which is configured to support the lead wire over the cylindrical protrusion.

15. A strain relief plug of claim 12, wherein the bar has a distal end that turns along the vertical axis to touch the printed circuit board and, thereby, enclose the lead wire channel.

16. A strain relief plug of claim 12, wherein: the bar has a second portion extending transverse the elongated stem to form a second lead wire channel; and the lead wire channel and the second lead wire channel are sized and configured to strain relief a plurality of the lead wires by pressing the plurality of lead wires therein directly against the printed circuit board.

17. A strain relief plug of claim 12, wherein the lead wire channel is sized and configured to strain relief a plurality of the lead wires by pressing the plurality of lead wires therein directly against the printed circuit board.

* * * * *